(12) United States Patent
Nguyen et al.

(10) Patent No.: US 10,381,200 B2
(45) Date of Patent: Aug. 13, 2019

(54) PLASMA CHAMBER WITH TANDEM PROCESSING REGIONS

(71) Applicant: Applied Materials, Inc., Santa Clara, CA (US)

(72) Inventors: Andrew Nguyen, San Jose, CA (US); Yogananda Sarode Vishwanath, Bangalore (IN); Xue Yang Chang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 337 days.

(21) Appl. No.: 15/453,868

(22) Filed: Mar. 8, 2017

(65) Prior Publication Data
US 2018/0261436 A1 Sep. 13, 2018

(51) Int. Cl.
*C23C 16/06* (2006.01)
*H01J 37/32* (2006.01)

(52) U.S. Cl.
CPC .. *H01J 37/32899* (2013.01); *H01J 37/32715* (2013.01); *H01J 37/32834* (2013.01); *H01J 37/32733* (2013.01); *H01J 2237/334* (2013.01)

(58) Field of Classification Search
CPC ........... H01J 37/32899; H01J 37/32715; H01J 37/32824; H01J 37/32733; C23F 16/06; C23F 16/22
See application file for complete search history.

(56) References Cited

U.S. PATENT DOCUMENTS

| | | | |
|---|---|---|---|
| 6,962,644 B2 | 11/2005 | Paterson et al. | |
| 7,276,122 B2 | 10/2007 | Devine et al. | |
| 7,655,092 B2 | 2/2010 | Fairbairn et al. | |
| 8,617,347 B2 * | 12/2013 | Kim .................. | C23C 16/4412 118/715 |
| 9,490,152 B2 | 11/2016 | Wang et al. | |
| 2005/0247265 A1 | 11/2005 | Devine et al. | |
| 2008/0011424 A1 | 1/2008 | Yin et al. | |
| 2009/0206056 A1 | 8/2009 | Xu et al. | |
| 2011/0031214 A1 | 2/2011 | Kim et al. | |
| 2016/0215883 A1 | 7/2016 | Nguyen et al. | |

* cited by examiner

*Primary Examiner* — Robert M Kunemund
(74) *Attorney, Agent, or Firm* — Patterson + Sheridan, LLP (57) ABSTRACT

A method and apparatus for processing substrates in tandem processing regions of a plasma chamber is provided. In one example, the apparatus is embodied as a plasma chamber that includes a chamber body having a first chamber side with a first processing region and a second chamber side with a second processing region. The chamber body has a front wall and a bottom wall. A first chamber side port, a second chamber side port, and a vacuum port are disposed through the bottom wall. The vacuum port is at least part of an exhaust path for each of the processing regions. A vacuum house extends from the front wall and defines a second portion of the vacuum port. A substrate support is disposed in each of the processing regions, and a stem is coupled to each substrate support. Each stem extends through a chamber side port.

20 Claims, 6 Drawing Sheets

PLASMA CHAMBER WITH TANDEM PROCESSING REGIONS

BACKGROUND

Field

Implementations described herein generally relate to plasma semiconductor substrate processing systems. More specifically, the implementations relate to a plasma chamber having tandem processing regions for processing two substrates simultaneously.

Description of the Related Art

Semiconductor processing generally involves the deposition of material and removal ("etching") of material from substrates. Plasma chambers having tandem processing regions are used in semiconductor processing to allow for processing of two substrates simultaneously. The plasma chamber includes a first chamber side for processing at least one substrate and a second chamber side for processing a second substrate. The chamber sides each include a movable substrate support disposed in a processing region. Each substrate support includes a substrate support surface that supports the substrate during plasma or other processing within the processing region. The substrate support further includes a stem that extends through a chamber side port located in a bottom wall of the plasma chambers.

It is conventional to pump down the plasma chamber to sub-atmospheric pressures (i.e., vacuum) using a shared pumping system having a vacuum pump coupled to both processing regions via a vacuum port. The vacuum port is located in a bottom wall of the plasma chamber and is open to both processing regions. The vacuum pump pumps out processed by-products from inside the plasma chamber through the vacuum port. The shared pumping system reduces components and cost of operation.

The plasma chambers such as described above increasingly use advanced technology in the processing of the substrates including electrical, radio frequency (RF), gas flow and thermal control to handle reduced device geometries and to achieve on substrate uniformity having improved yield and high throughput with lower cost per substrate. Electrical power lines, gas supply lines, and control lines (collectively utility lines) are used to couple the advanced technology used in the substrate support through the stem to gas supplies, electrical supplies, and controllers located outside of the plasma chamber. Improvements to substrate support is often limited by the size of the stem and no space is available for routing additional utility lines needed to implement additional advanced technology within the substrate support.

Therefore, there is a need for an improved a method and apparatus for processing substrates.

SUMMARY

Embodiments of the disclosure describe a method and apparatus for processing substrates. In one example, an apparatus for processing substrates includes a plasma chamber body having a first chamber side with a first processing region and a second chamber side with a second processing region. The chamber body includes a front wall, a back wall opposing the front wall, and a bottom wall connected between the front wall and the back wall. A first chamber side port and a second chamber side port disposed through the bottom wall, and a vacuum port is disposed on the bottom wall. The bottom wall defines a first portion of the vacuum port, and the vacuum port is at least part of an exhaust path for each of the first and second processing regions. A vacuum housing extends from the front wall, and the vacuum housing defines a second portion of the vacuum port. A first substrate is disposed in the first processing region. A first stem is coupled to the first substrate support, and the first stem extends through the first chamber side port. A second substrate support is disposed in the second processing region and a second stem is coupled to the second substrate support. The second stem extends through the second chamber side port.

In another embodiment, an apparatus for processing a substrate includes a chamber body having a first processing region and a second processing region separated by a partition wall. The chamber body has a bottom wall bounding the first and second processing regions and a vacuum port having a first portion disposed through the bottom wall. The vacuum port is fluidly coupled to the first and second processing regions. The chamber body further includes a front wall connected to the bottom wall and a vacuum housing connected to the front wall and extending outwardly from the front wall. The vacuum housing has a second portion of the vacuum port formed therein.

In another embodiment, a plasma chamber includes a first substrate support for supporting a substrate in a processing region. A first stem is coupled to the first substrate support and has a first longitudinal axis extending through the first stem. A second substrate support supports a substrate in a processing region and a second stem is coupled to the substrate support. The second substrate support has a second longitudinal axis extending through the second stem. A chamber body has a first chamber side including the first processing region and a second chamber side including the second processing region. The chamber body defines a first exhaust path for the first chamber side and a second exhaust path for the second chamber side. The chamber body includes a front wall, a bottom wall connected to the front wall. A first chamber side port and a second chamber side port are disposed in the bottom wall. The first stem extends through the first chamber side port and the second stem extends through the second chamber side port. The first chamber side port and the second chamber side port have an x-axis extending through the first longitudinal axis of the first stem and the second longitudinal axis of the second stem. A vacuum port is disposed in the bottom wall, and is positioned between the first chamber side port and the second chamber side port. The vacuum port is positioned toward the front wall and below the horizontal axis of the chamber side ports. The first exhaust path extends from the first processing region and to the vacuum port, and the second exhaust path extends from the second processing region and to the vacuum port.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only selected implementations of this disclosure and are therefore not to be considered limiting of its scope, for the disclosure may admit to other equally effective implementations.

To facilitate understanding, identical reference numerals have been used, wherever possible, to designate identical elements that are common to the Figures. Additionally, elements of one implementation may be advantageously adapted for utilization in other implementations described herein.

DETAILED DESCRIPTION

Embodiments herein generally provide apparatus adapted to concurrently process multiple substrates in tandem processing regions sharing a single vacuum port. The apparatus may be embodied as a plasma chamber that combines the advantages of single substrate process chambers and multiple substrate handling for high quality substrate processing, high substrate throughput, and a reduced system footprint. The plasma chamber includes a chamber body that has a first chamber side and a second chamber side. The chamber body is adapted to handle a multiple number of advanced technologies used in chamber interior regions.

Figure 1:
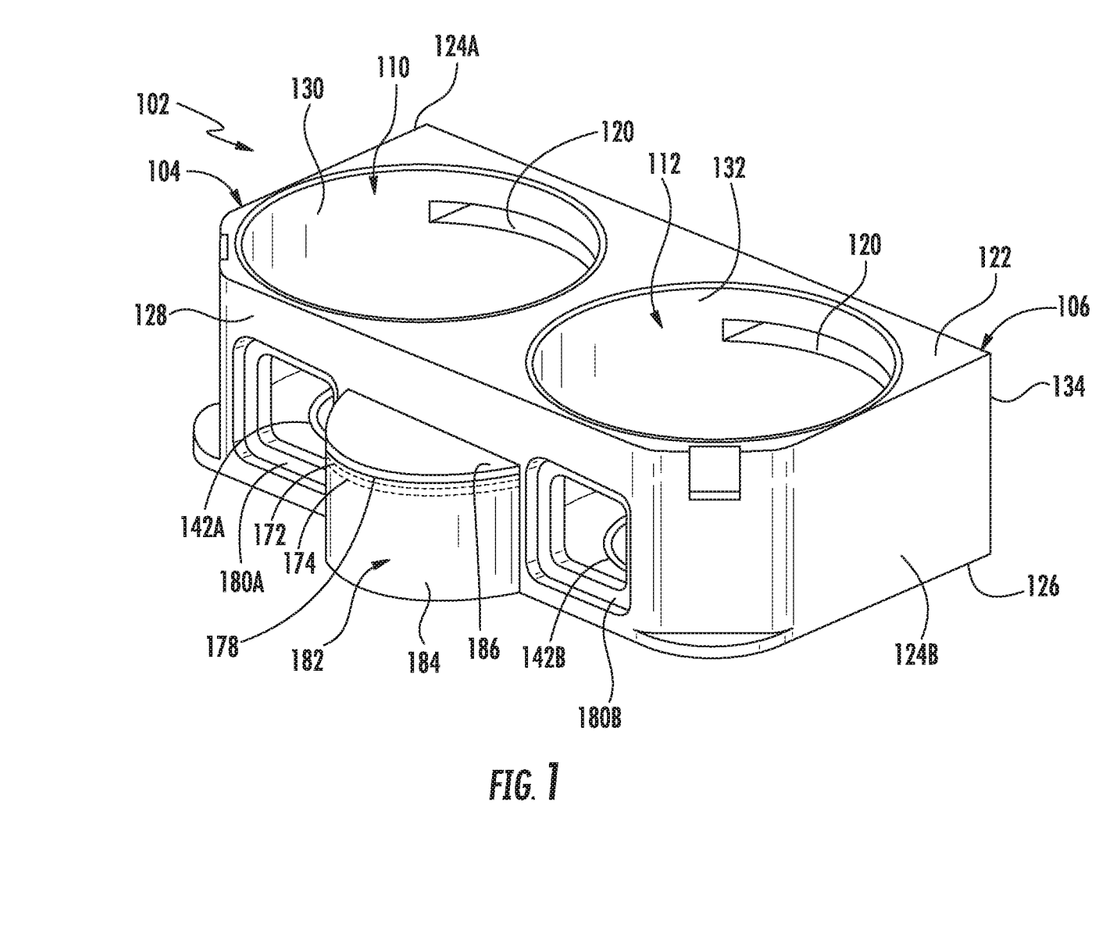
FIG. 1 depicts a top perspective view of a chamber body of a plasma chamber according to one implementation.
Figure 2:
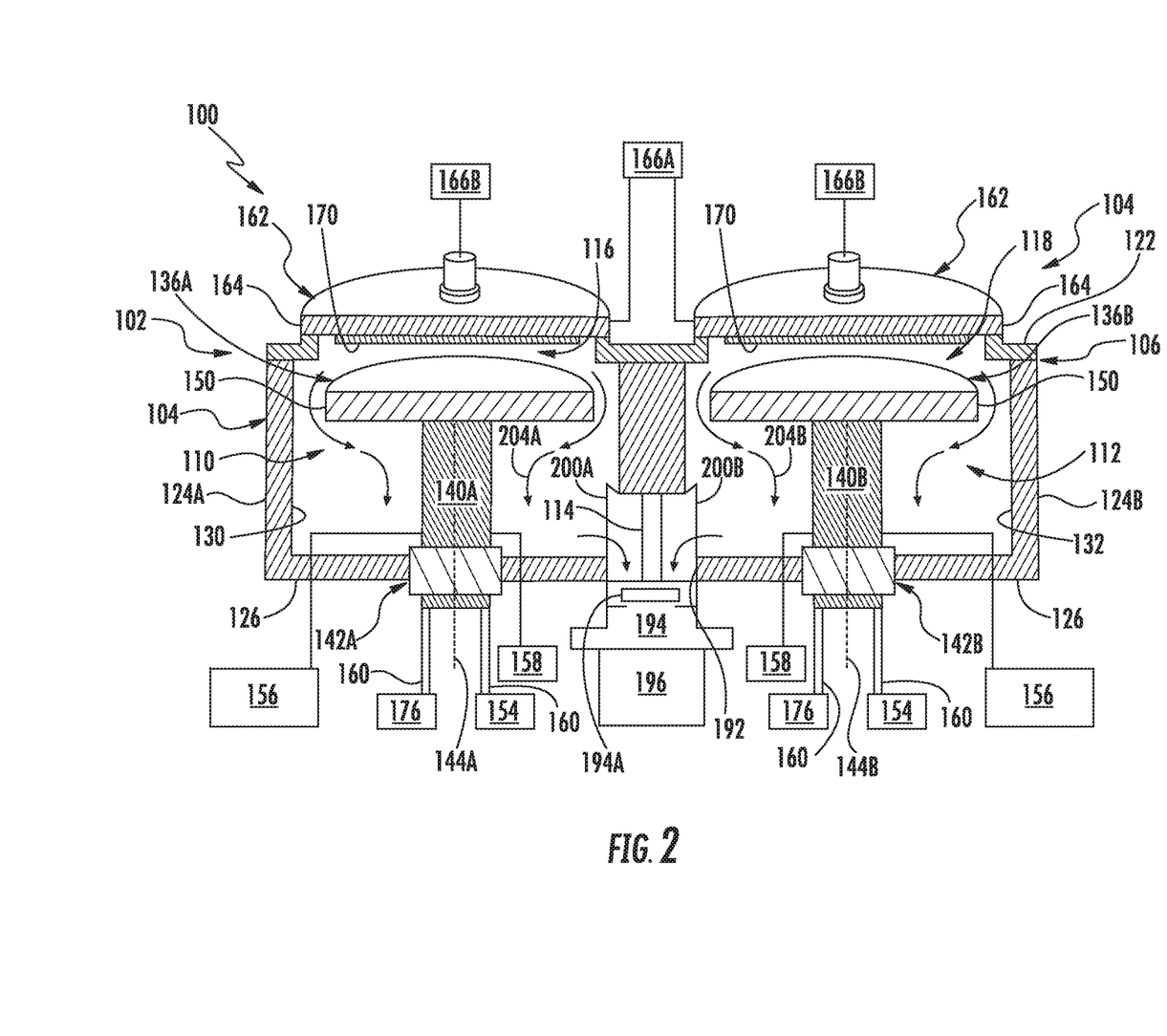
FIG. 2 depicts a front schematic sectional view of a plasma chamber according to one implementation.

FIG. 1 and FIG. 2 illustrate a front perspective view and a sectional view, respectively, of a plasma chamber 100 according to an embodiment. Referring to FIG. 1, the plasma chamber 100 includes a chamber body 102 having a first chamber side 104 and a second chamber side 106. Each of the first and second chamber sides 104, 106 includes a respective chamber interior region 110, 112. The chamber body 102 includes interior walls 130, 132, a top wall 122, a bottom wall 126, side walls 124A, 124B, and back wall 134. The chamber interior regions 110, 112 are bound by interior walls 130, 132. Substrate transfer ports 120 extend through the back wall 134 and into the chamber interior regions 110, 112.

A vacuum port housing 182 is coupled to the chamber body 102. In one example, the vacuum port housing 182 is disposed equidistant from a first service port 180A leading to the chamber interior region 110 of the first chamber side 104 and a second service port 180B leading to the chamber interior region 110 of the second chamber side 106. The service ports 180A, 180B have openable covers (not shown) and allow for access to the chamber interior regions 110, 112 for inspections and repairs.

The vacuum port housing 182 has a housing side wall 184 and housing top wall 186. In some embodiments, the vacuum port housing 182 is integrally formed with the front wall 128 of the chamber body 102. In some embodiments, the chamber body 102 and the vacuum port housing 182 are fabricated from a single mass of material. In other embodiments, the vacuum port housing 182 and the chamber body 102 may be separate components sealingly fastened or welded together. The chamber body 102 and vacuum port housing 182 may be made from aluminum or other metallic material. The housing side wall 184 extends from the front wall 128 of the chamber body 102. In one example, the housing side wall 184 has a convex or partial-cylindrical shape. The front wall 128 opposes the back wall 134 of the chamber body 102. In some embodiments, the front wall 128 and the opposing back wall 134 are parallel, for example, the section of the front wall 128 between the service ports 180A, 180B is parallel to the opposing section of back wall 134. The housing top wall 186 may be perpendicular to the front wall 128 and back wall 134. In some embodiments the housing top wall 186 may be positioned below the top wall 122 of the chamber body 102. In some embodiments, the vacuum port housing 182 has the benefit of providing additional space for equipment.

In an embodiment, the housing top wall 186 includes a housing lid 178. The housing lid 178 may be movable between open and closed positions. When in the closed position, the housing lid 178 forms a gas-tight seal within the housing top wall 186. In the embodiment shown in FIG. 1, the housing lid 178 has a lid o-ring 172 and a lid RF gasket 174. The lid o-ring 172 forms a gas-tight seal within the housing top wall 186 when the housing lid 178 is in a closed position. The lid RF gasket 174 provides grounding between the housing lid 178 and the housing side wall 184 when the housing lid 178 is in the closed position. When in the open position, the lid assembly 162 is positioned to allow access to a top opening of the vacuum port housing 182. This is beneficial because inspections, maintenance, and repairs of the vacuum port 192, and vacuum valve 194 and vacuum pump 196 shown in FIG. 2, may be made by opening the housing lid 178 of the vacuum port housing 182 so as to avoid the need to disassemble the vacuum valve 194 or vacuum pump 196, or access the vacuum port 192, vacuum valve 194, and vacuum pump 196 through the chamber interior regions 110, 112 of the chamber body 102.

Referring to FIG. 2, the chamber interior regions 110, 112 include processing regions 116, 118 and substrate transfer ports 120, shown in FIG. 1, are used for robotically loading and removing substrates to and from the processing regions 116, 118. A vacuum port 192 provides an opening in bottom wall 126 of chamber body 102 and is part of a first exhaust path 204A for the first processing region 116 and a second exhaust path 204B for the second processing region 118. The vacuum port 192 is coupled to a vacuum valve 194 (e.g., gate valve) and vacuum pump 196. In the embodiment shown in FIG. 2, the vacuum valve 194 is a vertical plunger valve that has a valve piston 194A that is disposed vertically with respect to the vacuum port 192 to control flow through the vacuum port 192 and provide pressure control for the chamber interior regions 110, 112. In some embodiments, the vacuum valve 194 may be a vertical plunger valve with a valve piston 194A disposed at least partially within the vacuum port housing 182. Different types of throttle gate valves may be used for the vacuum valve 194 in other embodiments. The vacuum pump 196 is generally configured to maintain the processing regions 116, 118 of the first chamber side 104 and the second chamber side 106 at a pressure desired for the substrate processing and to rapidly remove waste gases and processing by-products.

Each of the chamber interior regions 110, 112 are enclosed by a lid assembly 162. FIG. 1 illustrates the chamber body 102 without the lid assembly 162 to show the chamber interior regions 110, 112. A partition wall 114 is disposed between the respective first chamber side 104 and the second chamber side 106. In some embodiments, the partition wall 114 may extend from top wall 122 to bottom wall 126. The partition wall 114 separates the processing regions 116, 118 from each other.

Each of the chamber interior regions 110, 112 of the chamber body 102 has a respective substrate support 136A, 136B disposed therein. The substrate support 136A, 136B are each sized to support a substrate in processing regions 116, 118. The substrate supports 136A, 136B are connected to stems 140A and 140B. The substrate supports 136A, 136B are optionally movable in a rotational and/or a vertical direction along each longitudinal axis 144A and 144B. The stems 140A, 140B of the substrate supports 136A, 136B extend through chamber side ports 142A, 142B located in the bottom wall 126 of the chamber body 102. In one example, the substrate supports 136A, 136B include lower electrodes 150 for coupling RF energy into the processing regions 116, 118. In some embodiments, the lower electrodes 150 may be cathodes. The substrate supports 136A, 136B may optionally include an electrostatic chuck to hold the substrate on the substrate support 136A, 136B during processing. Utility lines 160 couple the lower electrodes 150 to power supply 154 that provide power for the lower electrodes 150.

The plasma chamber 100 may additionally include systems for raising and lowering the substrate supports 136A, 136B, rotating the substrate supports 136A, 136B, retaining and releasing the substrate, detection of an end of a process, internal diagnostics, heating the substrate, and the like. Such systems are collectively depicted in FIG. 2 as support systems 156. The support systems 156 may include mechanical apparatus extending through the stems 140A, 140B of the substrate supports 136A, 136B for use in the support systems 156. The utility lines 160 may include gas lines and electrical lines extending through the stems 140A, 140B of the substrate supports 136A, 136B to provide power to the substrate supports 136A, 136B and the support systems 156. The lid assembly 162 includes an upper electrode 164 coupled to a power supply 166A. In an embodiment, the upper electrode 164 is an anode. The upper electrode 164 and the lower electrode 150 are used to generate plasma in the processing regions 116, 118. The lid assembly 162 may also include a shower head 170 coupled to a gas supply 166B to provide process gas to the processing regions 116, 118.

The plasma chamber 100 further may include control and monitoring systems 158 and other advanced technologies that may have some components located in the chamber interior regions 110, 112 to control the lower electrode 150 and the processing environment in the processing regions 116, 118. In some embodiments, utility lines 160 may be used to power the control and monitoring systems 158.

The utility lines 160 are used to couple the substrate support 136A, 1366 disposed in the chamber interior regions 110,112 to power supply 154 and controller 176. The utility lines 160 extend through the stems 140A, 140B and the chamber side ports 142A, 142B to the chamber interior regions 110,112 where the utility lines 160 are coupled to the substrate support 136A, 136B and the control and monitoring systems 158. The utility lines 160 in some embodiments may include gas conduits, sensor wiring, electrical supply conductors, and fluid conduits. The stems 140A, 140B are sized to accommodate the utility lines 160 extending from outside the chamber body 102 to the chamber interior regions 110, 112. The chamber side ports 142A, 142B are sized to accommodate the portion of the stems 140A, 140B extending through the chamber side ports 142A, 142B.

As shown in FIG. 2, an exhaust path 204A for the first chamber side 104 extends through the chamber interior region 110 and extends from the processing region 116 of the first chamber side 104, through the interior wall opening 200A, and through the vacuum port 192. An exhaust path 204B for the second chamber side 106, as shown in FIG. 2 and illustrated by arrows, extends through the chamber interior region 112 and extends from the processing region 118 of the second chamber side 106, through the interior wall opening 200B, and through the vacuum port 192. The partition wall 114 is disposed between the first processing region 116 and the second processing region 118, separating at least a portion of the first exhaust path 204A for the first processing region 116 from the second exhaust path 204B for the second processing region 118. In some embodiments, the partition wall 114 may not extend to the vacuum port 192 and the exhaust path 204A, 204B would pass through interior wall openings 200A, 200B and into the vacuum port 192 without being separated by a partition wall 114.

Figure 3A:
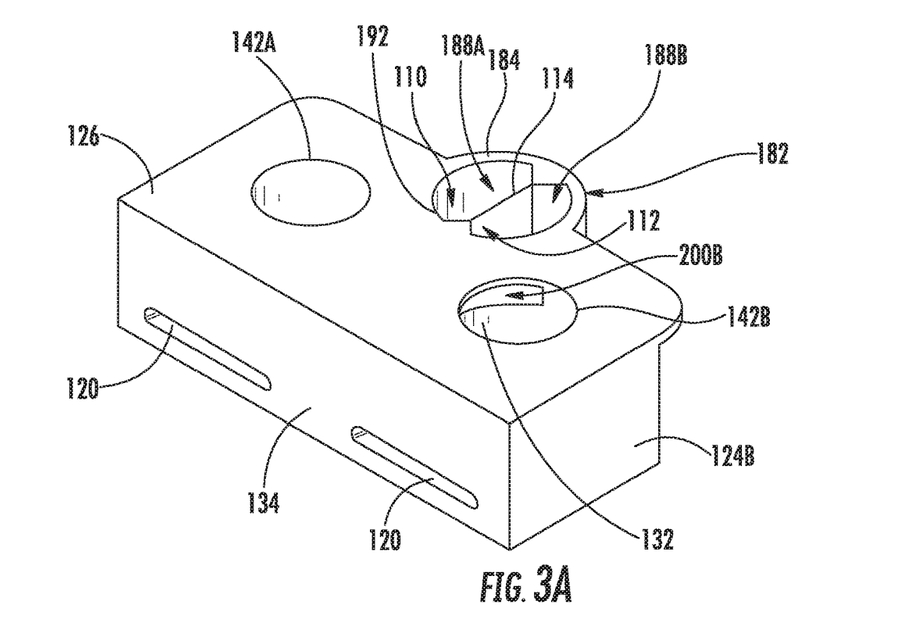
FIG. 3A depicts a bottom perspective view of a chamber body of a plasma chamber according to one implementation.
Figure 3B:
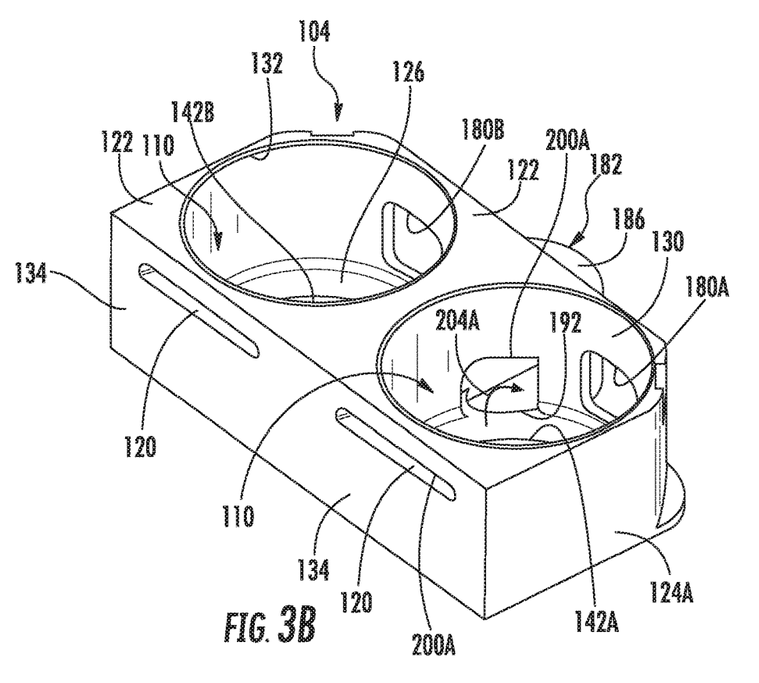
FIG. 3B depicts a top perspective view of a chamber body of a plasma chamber according to one implementation.

FIG. 3A and FIG. 3B illustrate a bottom perspective view and a top perspective view, respectively, of the chamber body 102 of the plasma chamber 100. The first chamber side port 142A and the second chamber side port 142B extend through the bottom wall 126. Vacuum port 192 in the bottom wall 126 is coupled to the chamber interior regions 110, 112. The partition wall 114 extends from the chamber interior region 110, 112 to the housing side wall 184 of the vacuum port housing 182. The partition wall 114 in the vacuum port housing 182, housing side wall 184, and housing top wall 186 form a first vacuum housing chamber 188A and a second vacuum housing chamber 188B. The partition wall 114 may extend from the bottom wall 126 of the chamber body 102 to the housing top wall 186 of the vacuum port housing 182 to separate the vacuum housing chambers 188A, 188B. In other embodiments, a partition wall 114 would not extend into the vacuum port housing 182. The vertical position of the housing top wall 186 of the vacuum port housing 182 on the front wall 128 may vary depending on the desired shape and volume of the vacuum port housing 182. In some embodiments, the bottom wall 126 may be a separate component that is attachable to chamber body 102 with bolts or other fasteners. The bottom wall 126 may include o-rings for vacuum sealing and RF gaskets for grounding between the bottom wall 126 and the chamber body 102. A bottom wall 126 that is detachable allows for multiple bottom walls 126 with each different bottom wall 126 having a different spacing between and sizes of the vacuum port 192, first chamber side port 142A and the second chamber side port 142B in the bottom wall 126. A chamber body 102 may be customized by changing the bottom wall 126 to meet different operational parameters.

In some embodiments, the first interior wall 130 and the second interior wall 132 of the chamber sides 104, 106 each have an interior wall opening 200A, 200B that extends from the bottom wall 126 vertically upwards and leads to the vacuum port 192 and the vacuum port housing 182. Exhaust path 204A is shown in FIG. 3B flowing through the interior wall opening 200A for the first chamber side 104. The interior wall openings 200A, 200B form a part of the exhaust path 204A, 204B for the first chamber side 104 and the second chamber side 106. As illustrated in FIG. 3A and FIG. 3B, first vacuum housing chamber 188A and second vacuum housing chamber 188B are each part of the exhaust path 204A and 204B, respectively.

Figure 3C:
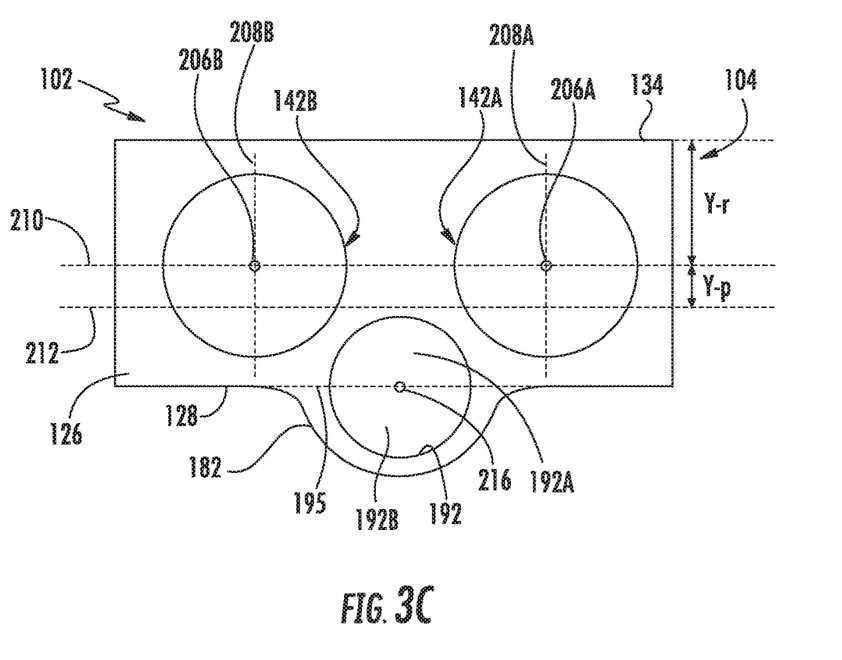
FIG. 3C depicts a bottom schematic view of a chamber body of a plasma chamber according to one implementation.

Referring to FIG. 3A and FIG. 3B, at least a portion of the housing side wall 184 of the vacuum port housing 182 extends outwardly from the front wall 128 of the chamber body 102. The housing side wall 184 and the bottom wall 126 define the perimeter surrounding the vacuum port 192 and lead from the chamber interior regions 110, 112 to outside the chamber body 102. As illustrated in FIG. 3C, the bottom wall 126 defines a first portion 192A of the vacuum port 192, and the vacuum port housing 182 defines a second portion 192B of the vacuum port 192 that extends outwardly from the front wall 128 and the perimeter of the bottom wall 126 that is adjacent the vacuum port 192. In FIG. 3C, the perimeter of the bottom wall 126 is illustrated by dashed line 195.

FIG. 3C illustrates a qualitative bottom view of the chamber body 102 of the plasma chamber 100 according to embodiments. The first chamber side port 142A and the second chamber side port 142B are symmetrically positioned between the back wall 134 and the front wall 128. An x-axis 210 extends through center 206A of the first chamber side port 142A and center 206B of the second chamber side port 142B. In some embodiments, the x-axis is a center line disposed halfway between back wall 134 and front wall 128 so that the first chamber side port 142A and the second chamber side port 142B are symmetrically positioned. For other embodiments, the first chamber side port 142A and the second chamber side port 142B may be asymmetrically positioned between the back wall 134 and the front wall 128, and the x-axis 210 is not a center line between the back wall 134 and the front wall 128.

A first y-axis 208A extends through center 206A and a second y-axis 208B extends through center 206B, and both are perpendicular to x-axis 210 in some embodiments. Longitudinal axis 144A, 144B corresponding to the stems 140A, 140B, as shown in FIG. 2, may extend through the centers 206A, 206B. The centers 206A, 206B of the chamber side ports 142A, 142B are positioned a selected vertical distance from the back wall 134 of the chamber body 102 that corresponds to a substrate loading position provided by substrate loading equipment used to load substrates through the substrate transfer ports 120 into a loading position in the processing regions 116, 118. This distance between the back wall 134 and the centers 206A, 206B of the chamber side ports 142A, 142B is represented as Y-r.

In an embodiment, the vacuum port 192 is disposed between the first y-axis 208A of the first chamber side port 142A and the second y-axis 208B of the second chamber side port 142B. The vacuum port 192 is disposed completely below the x-axis 210 towards the front wall 128 of the chamber body 102. The distance that the vacuum port 192 is below the x-axis 210 is represented by line 212 and Y-p. The perimeter of vacuum port 192 is completely below x-axis 210. A benefit of positioning the vacuum port 192 completely below the x-axis 210 and towards the front wall 128 is that size of the first chamber side port 142A and the second chamber side port 142B may be increased while providing structural integrity of the bottom wall 126. Structural integrity is needed to withstand the vacuum forces on the bottom wall 126 of the chamber body 102, and is improved by maintaining a selected separation between chamber side ports 142A, 1426 and vacuum port 192.

In the embodiments depicted in FIG. 1 and FIGS. 3A-3C, at least a portion of the vacuum port 192 extends beyond the front wall 128 of the chamber body 102 and resides in the vacuum port housing 182. In an embodiment, fifty percent of the surface area of the vacuum port 192 extends from the front wall 128 and vertically leads to the vacuum housing chambers 188A, 188B, and the other fifty percent of the surface area of the vacuum port 192 is defined by the bottom wall 126. In other embodiments, greater than fifty percent of the surface area of the vacuum port 192 extends beyond the front wall 128. The available surface area available on the bottom wall 126 for the first chamber side port 142A, second chamber side port 142B, and vacuum port 192 increases as increased portions of the vacuum port 192 extend beyond the front wall 128. This is beneficial because the increased surface area can be used to increase the surface area and diameter of the first chamber side port 142A and the second chamber side port so that the size and number of utility lines 160 routed through the chamber side ports 142A, 142B and stem 140A, 140B may be increased.

Figure 4A:
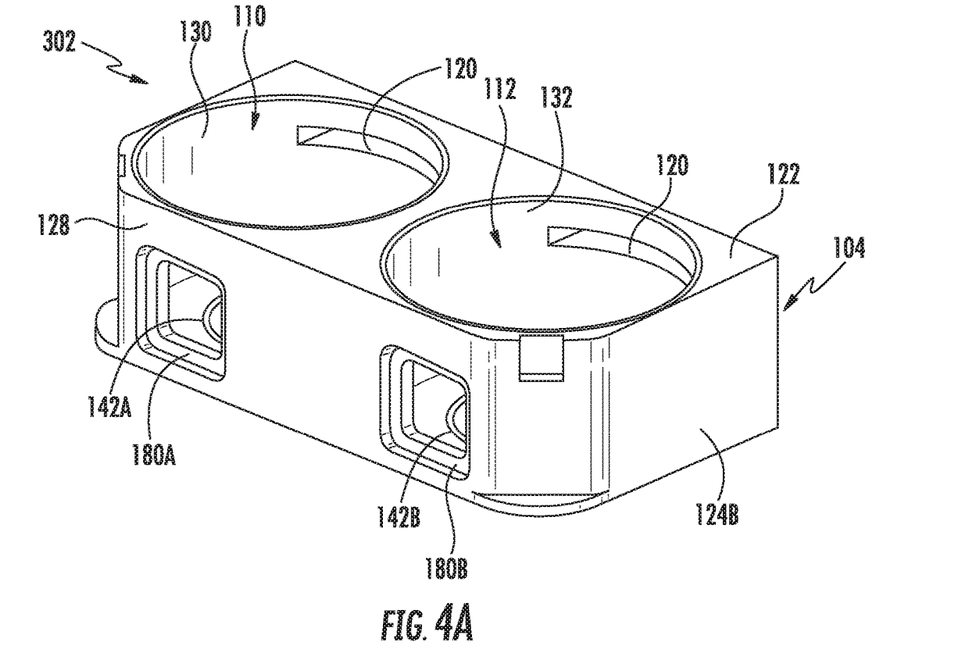
FIG. 4A depicts a top perspective schematic view of a chamber body of a plasma chamber according to one implementation.
Figure 4B:
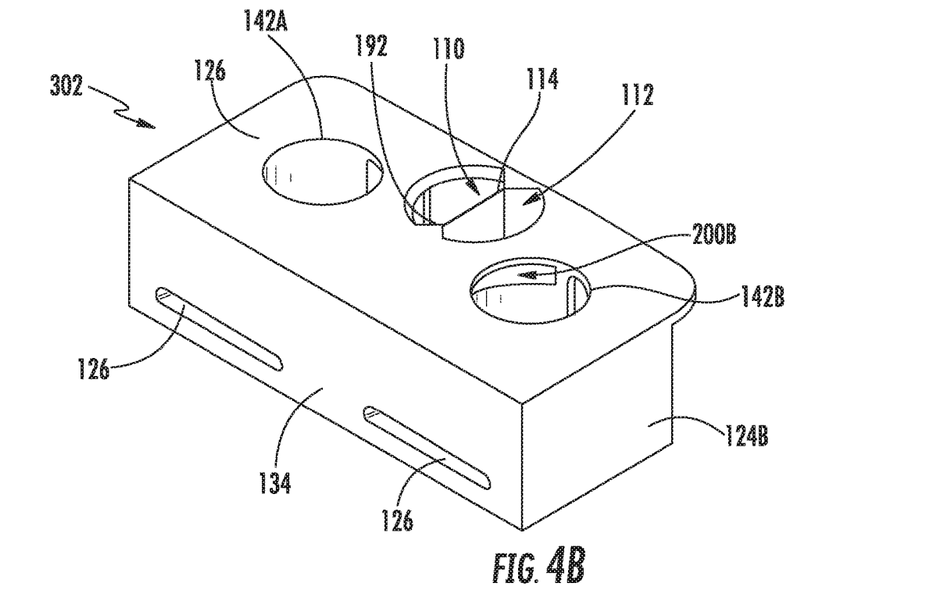
FIG. 4B depicts a bottom perspective schematic view of a chamber body of a plasma chamber according to one implementation.
Figure 4C:
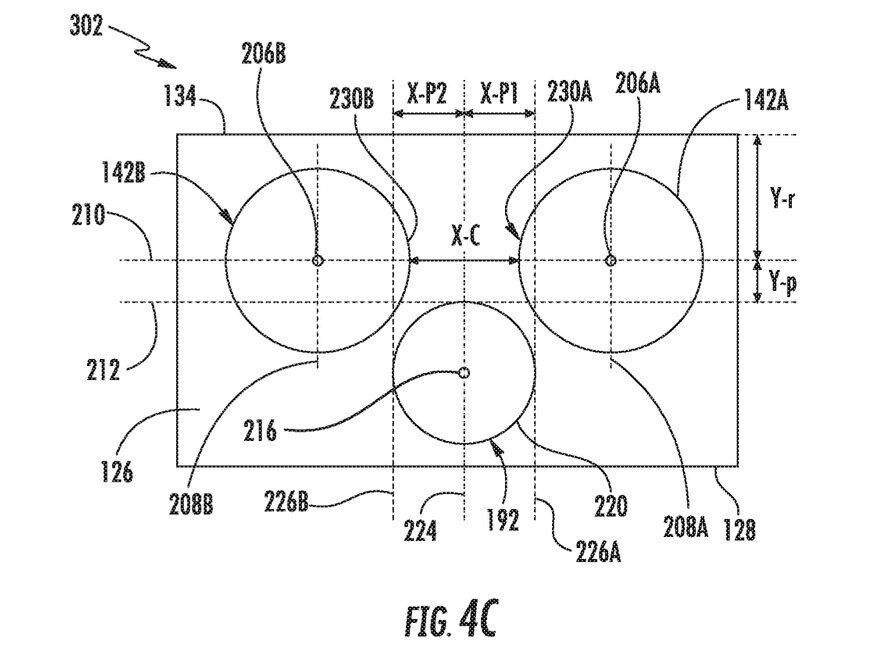
FIG. 4C depicts a bottom schematic view of a chamber body of a plasma chamber according to one implementation.

FIG. 4A and FIG. 4B illustrate a top perspective view and a bottom perspective view, respectively, of a chamber body 302 according to another embodiment. The vacuum port 192 is disposed on the chamber body 302 in a different position compared to the vacuum port 192 of the chamber body 102 embodiment shown in FIG. 1 and FIGS. 3A-C. More specifically, the vacuum port 192 shown in FIGS. 4A-C is disposed in the bottom wall 126 adjacent to the front wall 128. The vacuum port 192 is disposed within the perimeter of the bottom wall 126 and opens within the front wall 128 into the chamber interior regions 110, 112.

FIG. 4C illustrates a qualitative bottom view of the chamber body 302 of the plasma chamber 100 according to embodiments. In the embodiment disclosed in FIG. 4C, the first chamber side port 142A and the second chamber side port 142B are asymmetrically positioned between the back wall 134 and the front wall 128. More specifically, the chamber side ports 142A, 142B are closer to the back wall 134 than the front wall 128. The location of the chamber side ports 142A, 142B corresponds with equipment used to load substrates in the processing regions 116, 118 a selected distance from the back wall 134 of the chamber body 302. In other embodiments, the chamber side ports 142A, 142B may be symmetrically positioned between back wall 134 and front wall 128. An x-axis 210 extends through center 206A of the first chamber side port 142A and center 206B of the second chamber side port 142B. The x-axis 210 may be parallel to the front wall 128 and the back wall 134.

In an embodiment, the vacuum port 192 is disposed between the first y-axis 208A of the first chamber side port 142A and the second y-axis 208B of the second chamber side port 142B. The vacuum port 192 is disposed completely below the x-axis 210 so that vacuum port 192 is disposed towards the front wall 128 of the chamber body 102. The distance that the vacuum port 192 is below the x-axis 210 is represented by Y-p and the perimeter 220 of vacuum port 192 is below x-axis 210. By moving the vacuum port 192 completely below the x-axis 210, the vertical separation along the vertical axis 224 between chamber side ports 142A, 142B and vacuum port 192 is increased and is shown as Y-p on FIG. 42. This vertical separation Y-p allows the surface area of the chamber side ports 142A, 142B to be increased without overlapping with each other or vacuum port 192 while maintaining adequate spacing between chamber side ports 142A, 142B and vacuum port 192 to maintain structural integrity of the bottom wall 126.

As shown in FIG. 4C, a vertical axis 224, a first perimeter axis 226A, and a second perimeter axis 226B extend from the front wall 128 to the back wall 134 and are parallel. The vertical axis 224 extends through a center 216 of vacuum port 192. The distance between the vertical axis 224 and the first perimeter axis 226A is designated X-P1, and in some embodiments, may be the radius of vacuum port 192. The distance between the vertical axis 224 and the second perimeter axis 226B is designated X-P2, and in some embodiments, may be the radius of vacuum port 192. As shown in FIG. 4C, the perimeter 230A of the first chamber side port 142A extends over the first perimeter axis 226A, and the perimeter 230B of the second chamber side port 142B extends over the second perimeter axis 226B. The first chamber side port 142A and the second chamber side port 142B are separated by a chamber port separation distance, shown as X-C in FIG. 4C. The chamber port separation distance is the distance between the perimeter 230A and perimeter 230B. The vacuum port perimeter distance is the distance between the first perimeter axis 226A and the second perimeter axis 226B. The vacuum port perimeter distance is shown in FIG. 4C to be X-P1+X-P2, and in some embodiments may be the diameter of the vacuum port 192. The chamber port separation distance is less than the vacuum port perimeter distance. By having the chamber port separation distance less than the vacuum port perimeter distance, the surface areas of the chamber side ports 142A, 142B may be increased. The increased size of the chamber side ports 142A, 142B allows larger stems 140A, 140B to extend through the chamber side ports 142A, 142B.

By moving the chamber side ports 142A, 142B closer to the back wall 134 than the front wall 128 and by shifting the vacuum port 192 completely below x-axis 210, the vertical separation along a vertical axis 224 between chamber side ports 142A, 142B and vacuum pump 196 is increased and is shown as Y-p on FIG. 42. This vertical separation Y-p allows the surface area of the chamber side ports 142A, 142B to be increased without overlapping with each other or vacuum port 192 while maintaining adequate spacing between chamber side ports 142A, 142B and vacuum port 192 to maintain structural integrity of the bottom wall 134. Structural strength of the bottom wall 134 is needed to withstand stresses on the bottom wall including vacuum pressures during operation.

As shown in FIG. 2 and discussed previously, a multitude of utility lines 160 and support systems 156 extend into the chamber interior regions 110, 112 of chamber body 302 through the stems 140A, 140B to achieve the desired processing environment for processing substrates. Having a chamber body 302 that is adaptable to handle additional utility lines 160 and equipment needed to extend through the stems 140A, 140B and chamber side ports 142A, 142B is beneficial for better process control and improved processing results. This is achieved by increasing the size and diameter of the chamber side ports 142A, 142B to accommodate stems 140A, 140B with larger diameters and sizes.

In addition, the access to the vacuum pump 196 and the size of the vacuum port 192 may be increased in the embodiments described. This is beneficial because increasing the size and vacuum port diameter of the vacuum port 192 allows better vacuum generation with less power hungry and less expensive vacuum pumps 196. The described embodiments also allow for larger vacuum pumps 196 to be used because of the additional spacing of the vacuum port 192 from the chamber side ports 142A, 142B. Larger vacuum pumps 196 allow for higher vacuums to be maintained in the processing regions 116, 118, which advantageously increases the number and types of processes that may be performed.

While the foregoing is directed to embodiments of the present disclosure, other and further embodiments of the disclosure may be devised without departing from the basic scope thereof, and the scope thereof is determined by the claims that follow.

What is claimed is:

1. An apparatus for processing a substrate, comprising:
   a chamber body having a first chamber side with a first processing region and a second chamber side with a second processing region, the chamber body comprising:
      a front wall, a back wall opposing the front wall, and a bottom wall connected between the front wall and the back wall;
      a first chamber side port and a second chamber side port disposed through the bottom wall;
      a vacuum port disposed through the bottom wall, wherein the bottom wall defines a first portion of the vacuum port, and wherein the vacuum port is at least part of an exhaust path for each of the processing regions; and
      a vacuum housing extending from the front wall, and wherein the vacuum housing defines a second portion of the vacuum port;
   a first substrate support disposed in the first processing region and a first stem coupled to the first substrate support, the first stem extending through the first chamber side port; and
   a second substrate support disposed in the second processing region and a second stem coupled to the second substrate support, the second stem extending through the second chamber side port.

2. The apparatus of claim 1, wherein the chamber body comprises a partition wall disposed between the first processing region and the second processing region, the partition wall separating the exhaust paths for each of the processing regions, and wherein at least a portion of the partition wall is disposed in the vacuum housing.

3. The apparatus of claim 1, wherein the bottom wall has a perimeter adjacent the vacuum port and the vacuum port has a surface area extending through the bottom wall, and wherein at least fifty percent of the surface area of the vacuum port extends outwardly from the perimeter of the bottom wall that is adjacent the vacuum port.

4. The apparatus of claim 1, wherein the chamber body further comprises:
   a first substrate transfer port for loading a substrate into the first processing region and second substrate transfer port for loading a substrate in the second processing region.

5. The apparatus of claim 1, wherein the first substrate support has a first longitudinal axis extending through the first stem and the second substrate support has a second longitudinal axis extending through the second stem, wherein the vacuum port is positioned between the first chamber side port and the second chamber side port, wherein the first chamber side port and the second chamber side port have an x-axis extending through the first longitudinal axis of the first stem and the second longitudinal axis of the second stem, and wherein the vacuum port is positioned toward the front wall and completely below the x-axis of the first chamber side port and the second chamber side port.

6. The apparatus of claim 1, wherein the front wall has a first service port to the first processing region in the first chamber side and a second service port to the second processing region in the second chamber side, wherein the vacuum port is disposed between the first service port and the second service port, and wherein the front wall and the opposing back wall are parallel between the first service port and the second service port.

7. The apparatus of claim 1, wherein the vacuum housing includes a lid assembly movable between an open position and a closed position.

8. An apparatus for processing a substrate, comprising:
a chamber body having a first processing region and a second processing region separated by a partition wall, the chamber body comprising:
a bottom wall bounding the first and second processing regions;
a vacuum port having a first portion disposed through the bottom wall, the vacuum port fluidly coupled to the first and second processing regions;
a front wall connected to the bottom wall; and
a vacuum housing connected to the front wall and extending outwardly from the front wall, the vacuum housing having a second portion of the vacuum port formed therein.

9. The apparatus of claim 8, wherein the partition wall extends into the vacuum housing.

10. The apparatus of claim 8, wherein the bottom wall has a perimeter adjacent the vacuum port the vacuum port has a surface area extending through the bottom wall, and wherein at least fifty percent of the surface area of the vacuum port extends outwardly from the perimeter of the bottom wall that is adjacent the vacuum port.

11. The apparatus of claim 8, wherein the chamber body further comprises:
a back wall opposing the front wall and having a first substrate transfer port for loading a substrate into the first processing region and second substrate transport port for loading a substrate in the second processing region.

12. The apparatus of claim 8, wherein the vacuum housing comprises:
a lid assembly movable between an open position and a closed position.

13. The apparatus of claim 8, wherein the vacuum housing is removable from the chamber body.

14. The apparatus of claim 8, wherein the vacuum housing and the chamber body are fabricated from a single mass of material.

15. The apparatus of claim 8, wherein a first longitudinal axis extends through a first chamber side port disposed through the bottom wall and a second longitudinal axis extends through a second chamber side port disposed through the bottom wall; wherein the vacuum port is positioned between the first chamber side port and the second chamber side port, and the first chamber side port and the second chamber side port have an x-axis extending through the first longitudinal axis and the second longitudinal axis; and wherein the vacuum port is positioned toward the front wall and completely below the x-axis of the first chamber side port and the second chamber side port.

16. An apparatus for processing a substrate, comprising:
a first substrate support for supporting a substrate in a first processing region and a first stem coupled to the first substrate support, wherein the first substrate support has a first longitudinal axis extending through the first stem;
a second substrate support for supporting a substrate in a second processing region and a second stem coupled to the second substrate support, and wherein the second substrate support has a second longitudinal axis extending through the second stem;
a chamber body having a first chamber side including the first processing region and a second chamber side including the second processing region, the chamber body defining a first exhaust path for the first chamber side and a second exhaust path for the second chamber side and including:
a front wall;
a bottom wall connected to the front wall;
a first chamber side port and a second chamber side port disposed in the bottom wall, wherein the first stem extends through the first chamber side port and the second stem extends through the second chamber side port, and wherein the first chamber side port and the second chamber side port have an x-axis extending through the first longitudinal axis of the first stem and the second longitudinal axis of the second stem,
a vacuum port disposed in the bottom wall, wherein the vacuum port is positioned between the first chamber side port and the second chamber side port, and wherein the vacuum port is positioned toward the front wall and completely below the x-axis of the first chamber side port and the second chamber side port;
wherein the first exhaust path extends from the first processing region and to the vacuum port;
wherein the second exhaust path extends from the second processing region and to the vacuum port.

17. The apparatus of claim 16, wherein the vacuum port includes a vacuum port diameter, wherein the first chamber side port and the second chamber side port are separated by a chamber port separation distance, and wherein the vacuum port diameter is greater than the chamber port separation distance.

18. The apparatus of claim 16, wherein the chamber body further comprises a back wall opposing the front wall and having a first substrate transfer port for loading a substrate into the first processing region and a second substrate transfer port for loading a substrate in the second processing region.

19. The apparatus of claim 16, wherein the chamber body further comprises:
a back wall opposing the front wall, wherein the first chamber side port is closer to the back wall than the front wall.

20. The apparatus of claim 19, wherein the first chamber side port and the second chamber side port are asymmetrically aligned between the front wall and the back wall and the x-axis is parallel to the front wall and the back wall.

* * * * *